(12) United States Patent
Mizuguchi et al.

(10) Patent No.: US 11,591,687 B2
(45) Date of Patent: Feb. 28, 2023

(54) SPUTTERING TARGET AND PRODUCING METHOD THEREOF

(71) Applicant: JX Nippon Mining & Metals Corporation, Tokyo (JP)

(72) Inventors: Tomoji Mizuguchi, Ibaraki (JP); Hidetoshi Sasaoka, Ibaraki (JP); Haruhi Nakamura, Ibaraki (JP); Atsushi Gorai, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 435 days.

(21) Appl. No.: 16/741,838

(22) Filed: Jan. 14, 2020

(65) Prior Publication Data
US 2020/0283888 A1    Sep. 10, 2020

(30) Foreign Application Priority Data
Mar. 5, 2019 (JP) .............................. JP2019-040060

(51) Int. Cl.
*C23C 14/34* (2006.01)
*C23C 14/08* (2006.01)
*C04B 35/457* (2006.01)

(52) U.S. Cl.
CPC ........ *C23C 14/3414* (2013.01); *C04B 35/457* (2013.01); *C23C 14/086* (2013.01); *C04B 2235/3293* (2013.01); *C04B 2235/77* (2013.01)

(58) Field of Classification Search
CPC ....... C04B 35/01; C04B 35/457; C04B 41/91; C04B 2235/3286; C04B 2235/3293; C04B 2235/77; C04B 2235/963; C23C 14/086; C23C 14/3407; C23C 14/3414; H01J 37/3491

USPC ....................................... 204/298.12, 298.13
See application file for complete search history.

(56) References Cited

U.S. PATENT DOCUMENTS

| | | | |
|---|---|---|---|
| 2013/0020585 A1* | 1/2013 | Ishibashi | H01L 29/1608 438/510 |
| 2013/0270108 A1* | 10/2013 | Endo | H01J 37/3491 451/39 |
| 2014/0252354 A1 | 9/2014 | Ebata et al. | |
| 2015/0311071 A1 | 10/2015 | Ebata et al. | |

FOREIGN PATENT DOCUMENTS

| | | |
|---|---|---|
| CN | 105925942 A | 9/2016 |
| JP | 2003-183820 A | 7/2003 |
| JP | 2005-42169 A | 2/2005 |

(Continued)

OTHER PUBLICATIONS

Korean communication, with English translation, dated Feb. 8, 2021 in corresponding Korean patent application No. 10-2019-0168753.

*Primary Examiner* — Rodney G McDonald
(74) *Attorney, Agent, or Firm* — Nields, Lemack & Frame, LLC

(57) ABSTRACT

An object of the present invention is to provide a sputtering target that can suppress a generation amount of fine nodules which lead to an increase in substrate particles during sputtering, and a method for producing the same. A ceramic sputtering target, the sputtering target having a surface roughness Ra on a sputtering surface of 0.5 µm or less and an Svk value measured with a laser microscope on the sputtering surface of 1.1 µm or less.

9 Claims, 4 Drawing Sheets

(56) References Cited

FOREIGN PATENT DOCUMENTS

| JP | 2014-37617 A | 2/2014 |
|----|--------------|--------|
| TW | 201315705 A | 4/2013 |
| WO | 2016/027540 A1 | 2/2016 |

\* cited by examiner

[FIG. 1]
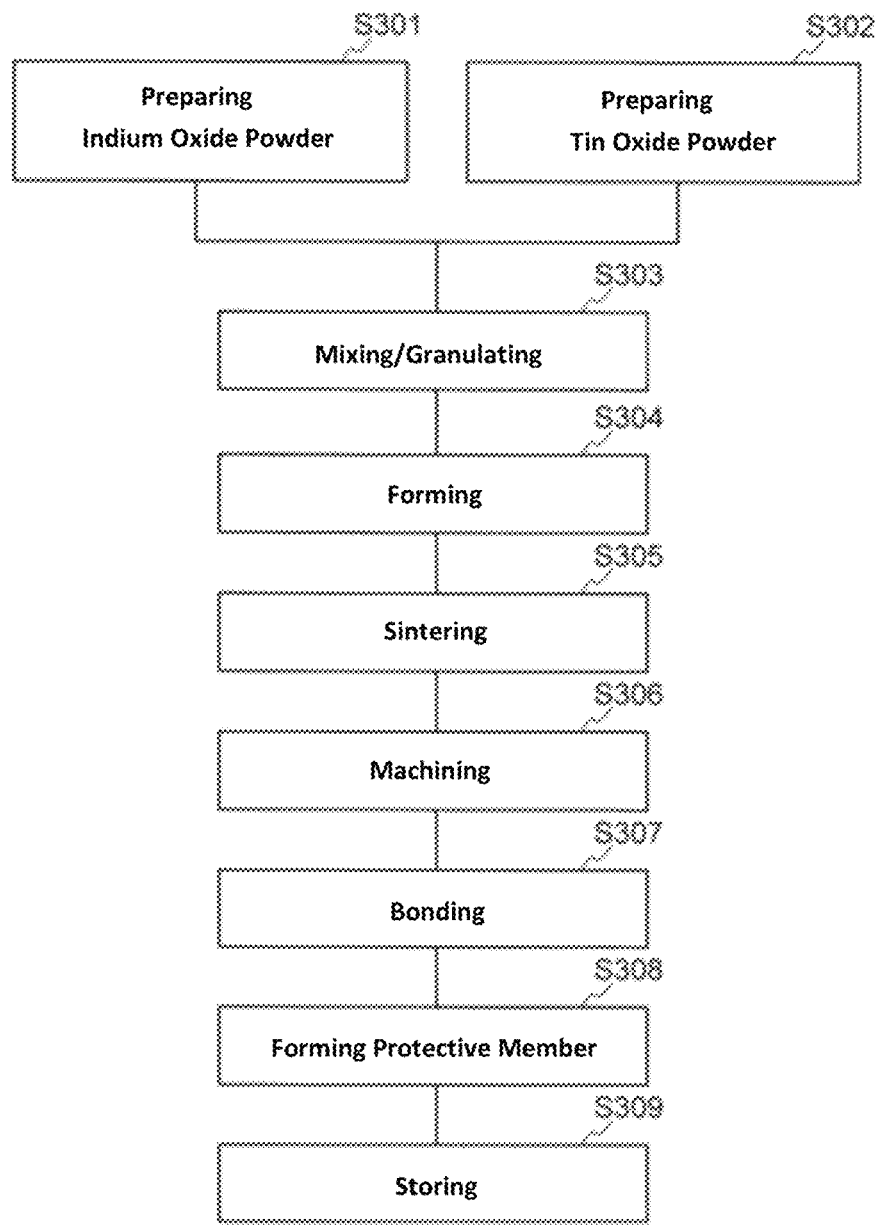

[FIG. 2]
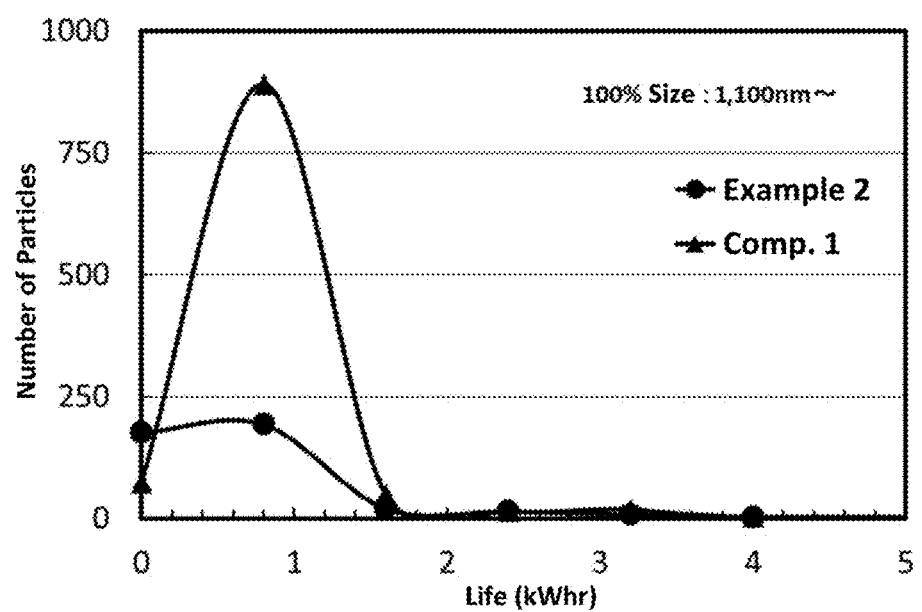

[FIG. 3]
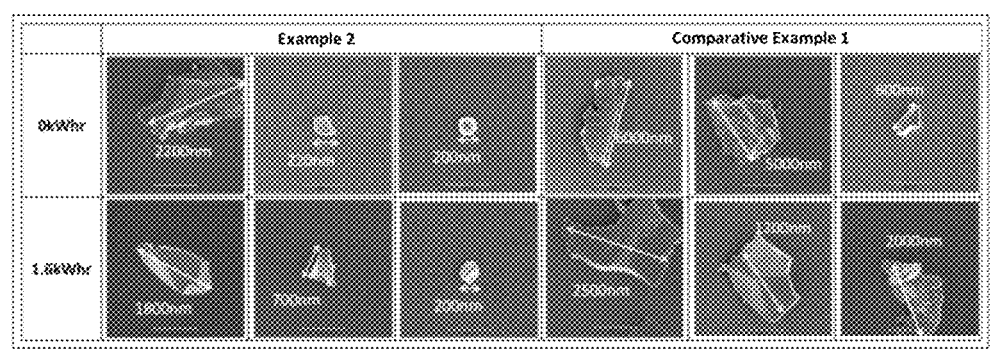

[FIG. 4]
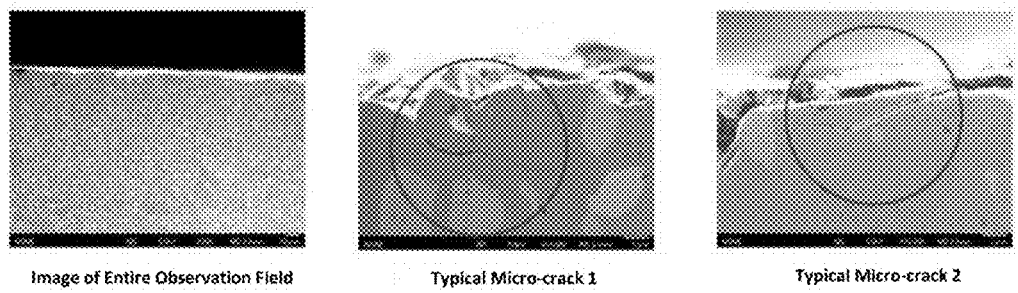
Image of Entire Observation Field     Typical Micro-crack 1     Typical Micro-crack 2

SPUTTERING TARGET AND PRODUCING METHOD THEREOF

TECHNICAL FIELD

The present invention relates to a sputtering target and a method for producing the same.

BACKGROUND ART

Sputtering is one of the methods for forming thin films of semiconductor devices. As a sputtering target (hereinafter also simply referred to as a "target") used for sputtering, a ceramic target is known in the art. The ceramic target material is obtained, for example, by forming powder or particles containing a ceramic component such as a metal oxide and sintering it, and machining the resulting sintered body into a predetermined size by cutting or polishing.

Recently, miniaturization to a nano-range has been progressing, and management of substrate particles has been increasingly strict in sputtering. Therefore, it is necessary to review the methods that have been carried out for many years and take measures leading to a decrease in the substrate particles during sputtering.

It is known that a processing accuracy of a sputtering target material affects a quality of a thin film (sputtered film) formed on a substrate surface. Therefore, measures for the processing of the sputtering target material made of ceramics have been studied for improving the quality of the thin film.

Patent Document 1 discloses a plate-shaped ceramic target in which a surface roughness Ra on a sputtering surface used for sputtering is 0.5 µm or more and 1.5 µm or less, and the maximum depth of cracks formed on the sputtering surface is 15 µm or less. It also discloses that when the Ra is less than 0.5 µm, nodules generated on the target material during sputtering does not stay on the target material and adhere as particles to the sputtered film, and the quality of the sputtered film tends to be deteriorated. Moreover, it also discloses that when the maximum depth of cracks is more than 15 µm, the nodules tend to be generated during sputtering, and the mechanical strength of the target material may be affected.

CITATION LIST

Patent Literature

Patent Document 1: WO 2016/027540 A1

SUMMARY OF INVENTION

Technical Problem

In order to form a sputtering surface of a sputtering target, it is known that a ceramic sintered body is processed using a processing machine called a surface grinder. Here, micro-cracks may be present on the sputtering surface due to the surface grinding. It has been confirmed that the micro-cracks affect an amount of substrate particles at an initial stage of use.

In Patent Document 1, the ceramic sintered body is cut rather than the use of the surface grinding of the ceramic sintered body, and the cut surface is used as a sputtering surface to suppress the generation of micro-cracks. On the other hand, Patent Document 1 does not sufficiently study the suppression of micro-cracks in the case of surface grinding of the ceramic sintered body. Further, the surface roughness Ra of the sputtering surface of 0.5 µm or more cannot be necessarily contributed to reduction of substrate particles.

In addition, there are a plurality of techniques that evaluate a surface roughness, an amount of residual dust, or the like and evaluate an amount of arcing, an amount of nodules, or an amount of substrate particles during sputtering. However, only with these evaluations, fine nodules generated at the initial stage of use and correlation with an amount of substrate particles have not been sufficiently revealed.

The present invention has been created in view of such situations. An object of the present invention provides a sputtering target that can suppress a generation amount of fine nodules which lead to an increase in substrate particles during sputtering, and a method for producing the same.

Solution to Problem

As a result of intensive studies, the present inventors have found that a surface roughness Ra on a sputtering surface of a sputtering target and an Svk value measured with a laser microscope on the sputtering surface are in close relation to the generation of nodules which lead to an increase in substrate particles. In particular, the present inventors have found that depressed portions remaining on the target surface (portions from which small pieces are released due to stress during machining), represented by the Svk value, affect the generation of fine nodules at the initial stage of use. Therefore, it is important to control the Ra and Svk values as stated above. Thus, embodiments of the present invention are specified as follows:

(1)

A ceramic sputtering target, the sputtering target having a surface roughness Ra on a sputtering surface of 0.5 µm or less and an Svk value measured with a laser microscope on the sputtering surface of 1.1 µm or less.

(2)

The ceramic sputtering target according to (1), wherein a number of micro-cracks confirmed by observation of a cross-sectional structure in a field of view at magnifications of 10,000 with an electron microscope is 20/mm or less on the sputtering surface.

(3)

The ceramic sputtering target according to (1) or (2), wherein the ceramic sputtering target comprises ITO having a Sn content of from 1 to 10% by mass in terms of $SnO_2$.

(4)

The ceramic sputtering target according to any one of (1) to (3), wherein the surface roughness Ra on the sputtering surface is 0.1 µm or more.

(5)

A method for producing a ceramic sputtering target, the method comprises the steps of: preparing a ceramic sintered body; and subjecting the ceramic sintered body to surface grinding to form a sputtering surface, wherein a surface roughness Ra on the sputtering surface is 0.5 µm or less, and an Svk value measured with a laser microscope on the sputtering surface is 1.1 µm or less after the surface grinding.

(6)

The method for producing the ceramic sputtering target according to (5), wherein a grindstone finally used in the surface grinding of the ceramic sintered body has:

a count #400 or more and less than 500, and a degree of concentration of abrasive grains of 125 or more, or a count #500 or more and less than 800, and a degree of concentration of abrasive grains of 90 or more, or a count #800 or more, and a degree of concentration of abrasive grains of 75 or more.

(7)

The method for producing the ceramic sputtering target according to (5) or (6), wherein a number of micro-cracks confirmed by observation of a cross-sectional structure in a field of view at magnifications of 10,000 with an electron microscope is 20/mm or less on the sputtering surface after the surface grinding.

(8)

The method for producing the ceramic sputtering target according to any one of (5) to (7), wherein the ceramic sputtering target comprises ITO having a Sn content of from 1 to 10% by mass in terms of $SnO_2$.

(9)

The method for producing the ceramic sputtering target according to any one of (5) to (8), wherein the surface roughness Ra on the sputtering surface is 0.1 μm or more.

Advantageous Effects of Invention

According to an embodiment of the present invention, it is possible to provide a sputtering target that can suppress a generation amount of fine nodules which lead to an increase in substrate particles during sputtering, and a method for producing the same.

BRIEF DESCRIPTION OF DRAWINGS

FIG. 1 is a process flow showing a method for producing a sputtering target according to an embodiment of the present invention.

FIG. 2 is a graph showing results of sputtering evaluations for Example 2 and Comparative Example 1.

FIG. 3 is a view showing results of sputtering evaluations for Example 2 and Comparative Example 1.

FIG. 4 is a view showing a micro-crack observation method.

DESCRIPTION OF THE PREFERRED EMBODIMENTS

Hereinafter, embodiments of the present invention will be described. However, it should be understood that the present invention is not limited to the following embodiments, and design changes, improvements, or the like may be made based on ordinary knowledge of those skilled in the art without departing from the spirit of the present invention.

(1. Sputtering Target)

In an embodiment, a shape of a sputtering target is not particularly limited, and may be any shape such as a flat plate shape or a cylindrical shape as long as the sputtering target has a sputtering surface. Preferably, the sputtering target may be flat-shaped. The sputtering surface is a surface on which sputtering is to be carried out as a product. When the sputtering target is flat-shaped, it generally has a backing plate for supporting the sputtering target. As the backing plate, a conventionally used backing plate can be appropriately selected and used. For example, stainless steel, titanium, a titanium alloy, copper, or the like can be used, although not limited thereto. The backing plate is generally bonded to the sputtering target via a bonding material, and as the bonding material, any conventionally used bonding material can be appropriately selected and used. Examples of the bonding material include, but not limited to, indium metal and the like.

The sputtering target according to this embodiment may not be limited as long as it is made of a ceramic sintered body, and its composition is not specifically limited. The composition of the ceramics forming the sputtering target is not particularly limited, and for example, ITO (indium tin oxide) having a Sn content of from 1 to 10% by mass in terms of $SnO_2$ is suitable.

It should be noted that the ceramic sintered body is generally subjected to processing such as surface grinding after sintering. As used herein, a ceramic sintered body before surface grinding is referred to as a ceramic sintered body, and the ceramic sintered body after surface grinding is referred to as a sputtering target.

A surface roughness Ra on the sputtering surface of the sputtering target is 0.5 μm or less, and preferably 0.4 μm or less, and more preferably 0.3 μm or less. If the surface roughness Ra on the sputtering surface greatly exceeds 0.5 μm, a tip portion of a machined surface is released during a sputtering phenomenon at an initial stage of use, which will cause generation of substrate particles or nodules. Here, the surface roughness Ra means "an arithmetic average roughness Ra" as defined in JIS B0601: 2013. A stylus type surface roughness meter is used for the measurement.

On the other hand, there are portions that are not eroded (non-erosion portions) on the sputtering surface of the sputtering target. It is desirable that a film or powder attached to the non-erosion portions are not peeled off or scattered during sputtering. In view of the adhesion between the sputtering surface of the sputtering target and the film or powder in this point of view, an excessively smooth state is considered to be undesirable. In fact, it has been confirmed that when the Ra is 0.1 μm or less, the film or powder adhering to the non-erosion portions is easily peeled off and scattered to affect an amount of substrate particles. Therefore, the surface roughness Ra on the sputtering surface of the sputtering target is preferably 0.1 μm or more, and more preferably 0.2 μm or more.

On the sputtering surface of the sputtering target, an Svk value measured with a laser microscope is 1.1 μm or less, and preferably 1.0 μm or less, and more preferably 0.5 μm or less. According to the findings of the present inventors, the Svk value on the sputtering surface is closely related to micro-cracks, and controlling of the Svk value can suppress the generation of the micro-cracks, thereby suppressing the generation of fine nodules leading to an increase in substrate particles. Although no particular lower limit is set for the Svk value, it is generally 0.2 μm or more, and typically 0.4 μm or more, in order to prevent production difficulty and costs from being increased.

The Svk value is one of surface roughness parameters defined by ISO 25178, and represents an average depth of protruding valleys of a load curve. When subjecting the ceramic sintered body to surface grinding, a part of a surface layer structure of the ceramic sintered body may be scraped off (hereinafter referred to as "peeled off"), which causes valley formation and increases the Svk value. A part of the surface layer structure is scraped off due to stress during machining, and micro-cracks extend inside the target as machining damages. Therefore, in order to suppress the generation of micro-cracks it is necessary to control surface grinding conditions to suppress the generation of valleys. The surface grinding conditions will be described later.

A relationship between the Svk value and the micro-cracks will be more specifically described. A state where a part of the ground surface is peeled off is evaluated to be an increase in the Svk value as damages occurred during the surface grinding. Moreover, a state which did not lead to peeling-off is detected by micro-cracks. With regard to each influence, the peeled-off surface evaluated as an increase in the Svk value affects an increase in an amount of substrate particles as generation of fine nodules at an initial stage of the sputtering phenomenon. On the other hand, positions where the micro-cracks are generated proceeds to the peeled-off state due to thermal history or the like during sputtering, and are detected as, for example, substrate particles having a size of several µm. Therefore, in the present invention, it is not necessarily essential to control the number of micro-cracks on the sputtering surface, but it is preferable to control the number of micro-cracks in terms of minimizing the possibility of leading to peeling-off.

In view of the foregoing, the number of micro-cracks confirmed by observation of the cross-sectional structure in a field of view at magnifications of 10,000 with an electron microscope is preferably 20/mm or less on the sputtering target according to the present embodiment. The number of micro-cracks is expressed as a number per a length of 1 mm of an upper end portion on the sputtering surface side in the observation of the cross-sectional structure. The micro-cracks have origins on a machined surface (ground surface) =a sputtering surface, and those having a maximum width of 0.1 µm or less and a length of 0.1 µm or more are counted. More particularly, the observation of the cross-sectional structure in the field of view at magnifications of 10,000 with the electron microscope is repeated until ten micro-cracks are observed along the sputtering surface, and converted into the number of micro-cracks per a length of 1 mm of the upper end portion on the sputtering surface side. However, when the number of micro-cracks does not reach 10 even if 80 fields of view are observed, the number of micro-cracks per a length of 1 mm of the upper end portion on the sputtering surface side is calculated based on the results of observing up to 80 fields of view. If the number of micro-cracks is 20/mm or less, the generation of fine nodules leading to an increase in substrate particles can be suppressed as described above.

(2. Method for Producing Sputtering Target)

A method for producing the sputtering target according to the present invention is then described by illustrating an ITO sputtering target as an example. FIG. 1 is a process flow showing a method for producing a sputtering target according to an embodiment of the present invention.

First, raw materials for forming the sintered body are prepared. In this embodiment, indium oxide powder and tin oxide powder are prepared (S301, S302). Each of these raw materials generally has a purity of 2N (99% by mass) or more, and preferably 3N (99.9% by mass) or more, and more preferably 4N (99.99% by mass) or more. If the purity is lower than 2N, a sintered body 120 contains a large amount of impurities, which causes a problem that desired physical properties cannot be obtained (for example, a decrease in transmittance of the formed thin film, an increase in resistance, and generation of particles due to arcing).

These raw material powders are then pulverized and mixed (S303). The raw material powders can be pulverized and mixed using a dry method with balls and beads (so-called media) of zirconia, alumina, a nylon resin, or the like, or using a wet method such as a media stirring mill with those balls or beads, a media-free container rotary mill, a mechanical stirring mill, and an airflow mill. Here, since the wet method generally has better pulverizing and mixing ability as compared to the dry method, it is preferable to carry out the mixing using the wet method.

Although the composition of the raw materials is not particularly limited, it is desirably adjusted according to an intended composition ratio of the sintered body.

A slurry of the raw material powders is then dried and granulated (S303). In this process, the slurry may be rapidly dried using rapid drying granulation. The rapid drying granulation may be carried out by adjusting a temperature and an air volume of hot air using a spray dryer.

A mixture obtained by mixing and granulating process as described above (or a pre-sintered body when pre-sintering is carried out) is subjected to pressure forming to form a flat plate-shaped formed body (S304). By this step, the mixture is formed into a shape suitable for an intended sintered body. In the forming process, a forming pressure can be controlled to form a formed body having a relative density of 54.5% or more and 58.0% or less. The relative density of the formed body in the above range can allow the relative density of the sintered body obtained by subsequent sintering to be 99.7% or more and 99.9% or less.

The flat plate-shaped formed body obtained in the forming step is sintered (S305). An electric furnace is used for the sintering. Sintering conditions can be appropriately selected depending on the composition of the sintered body. For example, ITO containing 10% by mass of $SnO_2$ can be sintered by placing it in an oxygen gas atmosphere at a temperature of from 1400° C. to 1600° C. for 10 hours or more and 30 hours or less. If the sintering temperature is lower than the lower limit, the relative density of the sintered body is lowered. On the other hand, if the temperature is higher than 1600° C., the electric furnace and the furnace material are greatly damaged and frequent maintenance is required, so that a working efficiency is remarkably lowered. Moreover, if the sintering time is shorter than the lower limit, the relative density of the sintered body 120 will be lowered.

In order to form the sputtering surface of the sintered body, it is then ground with a surface grinder. In the surface grinder, the sintered body is placed on a table such that a surface to be processed (a surface corresponding to the sputtering surface) is an upper surface, and surface processing is carried out using a grindstone.

Here, it is preferable that the grindstone to be finally used in the surface grinding process has:
  a count #400 or more and less than 500 and a degree of concentration of abrasive grains of 125 or more, or
  a count #500 or more and less than 800 and a degree of concentration of abrasive grains of 90 or more, or
  a count #800 or more and a degree of concentration of abrasive grains of 75 or more.

This can allow the sputtering target having the surface roughness Ra on the sputtering surface of 0.5 µm or less and the Svk value measured with a laser microscope on the sputtering surface of 1.1 µm or less to be easily obtained. Needless to say, processing conditions such as a rotational number of the grindstone and a feed rate can be optimized according to the count of the grindstone and the degree of concentration of abrasive grains. Here, the count refers to a grain size as defined in JIS R6001-2: 2017. The degree of concentration of abrasive grains refers to a concentration as defined in JIS B4131: 1998.

In addition, other physical properties of the produced sputtering target are the same as those described above.

EXAMPLES

Hereinafter, the present invention will be described based on Examples and Comparative Examples. In addition, Examples are only illustrative, and the present invention is not limited at all by the Examples. In other words, the present invention is limited only by the scope of the claims, and includes various modifications other than Examples included in the present invention.

Example 1

(Rough Grinding)

An ITO plate-shaped ceramic sintered body having a tin oxide content of 10% by mass was prepared. One surface side of the ceramic sintered body was subjected to a rough grinding process using a grindstone having a count #80 by means of a surface grinder from OKAMOTO MACHINE TOOL WORKS, LTD., under conditions of a grindstone rotational speed of 1800 rpm, an amount of cut depth of 50 µm/pass, and a sparkout of 4 passes.

(Fine Grinding)

A fine grinding process was then carried out using a grindstone having a count #400 and a degree of concentration of abrasive grains of 125 by means of a surface grinder from OKAMOTO MACHINE TOOL WORKS, LTD., under conditions of a grindstone rotational speed of 1250 rpm, an amount of cut depth of 10 µm/pass, a total amount of cut depth of 170 µm, and a sparkout of 6 passes. A further fine grinding process was then carried out using the same grindstone under conditions of a grindstone rotational speed of 1250 rpm, an amount of cut depth of 1 µm/pass, a total amount of cut depth of 30 µm, and a sparkout of 6 passes.

Examples 2 to 3, Comparative Example 1

The rough and fine grinding processes were carried out under the same conditions as those of Example 1, with the exception that the rotational speed of the grindstone was changed to 1400 rpm and the count and degree of concentration of abrasive grains of the grindstone were changed in the fine grinding process as shown in Table 1.

Example 4

After carrying out the rough and fine grinding processes under the same conditions as those of Example 1, a further fine grinding process was carried out using a grindstone having the count and degree of concentration of abrasive grains as shown in Table 1, under conditions of a grindstone rotational speed of 2300 rpm, an amount of cut depth of 2 µm/pass, a total amount of cut depth of 100 µm and a sparkout of 6 passes.

Comparative Example 2

In Comparative Example 2, the rough and fine grinding processes were carried out under the same conditions as those of Comparative Example 1, and a further fine grinding process was then carried out using model SDK-P1000NC wet polisher from AMADA SANWA DAYA CO., LTD., which was equipped with a #800 sponge grindstone (φ300 mm). The grinding conditions were a grindstone rotational speed of 210 rpm and an amount of cut depth of 12 µm/pass (a total amount of cut depth of 150 µm).

TABLE 1

| | Apparatus | Grindstone Count | Degree of Concentration of Abrasive Grains |
|---|---|---|---|
| Example 2 | Surface Grinder | #400 | 150 |
| Example 3 | Surface Grinder | #500 | 90 |
| Example 4 | Surface Grinder | #800 | 75 |
| Comparative Example 1 | Surface Grinder | #400 | 75 |
| Comparative Example 2 | Surface Grinder | #400 | 75 |
| | Polisher | #800 | — |

(Measurement of Surface Roughness Ra with Surface Roughness Meter)

From each of the ITO sputtering targets according to Examples and Comparative Examples after the fine grinding process or the grinding process with the polisher as described above, a sample having a size of 200 mm×300 mm was cut out and washed with ultrasonic wave for 5 minutes. Subsequently, the Ra was measured at five positions using a Mitutoyo stylus type surface roughness meter (Surftest SJ-301) according to the conditions shown in Table 2 below, and its average value was calculated. It should be noted that the above five positions are four positions near the four corners and one position at the center.

TABLE 2

| Control Items | Setting |
|---|---|
| Evaluated Length (mm) | 4 |
| Measured Speed (mm/s) | 0.5 |
| Measured Force (mN) | ≤4 |
| Number of Measurements (times/position) | 5 |
| Radius of Curvature of Tip of Stylus (µm) | 5 |
| Measured Direction | Parallel to Grinding Direction |

(Measurement of Svk Value with Laser Microscope)

From each of the ITO sputtering targets according to Examples and Comparative Examples after the fine grinding process or the grinding process with the polisher as described above, a sample having a size of 20 mm×20 mm was cut out, and washed with ultrasonic wave for 5 minutes. Subsequently, the Svk value was measured using a Keyence laser microscope VK-9700. The measurement was carried out using a violet laser having a wavelength of 408 nm, while specifying a measurement area in a field of view at magnifications of 50.

(Evaluation of Number of Micro-Cracks in Cross Section)

From each of the ITO sputtering targets according to Examples and Comparative Examples after the fine grinding process or the grinding process with the polisher as described above, a sample having a size of 20 mm×20 mm was cut out, and washed with ultrasonic wave for 5 minutes. Subsequently, a cross section perpendicular to the sputtering surface was subjected to structure observation with a JEOL electron microscope JSM-6700F and the number of micro-cracks per a length of 1 mm of an upper end portion on the sputtering surface side was confirmed in a field of view at magnifications of 10,000 (see FIG. 4). The determination of the micro-cracks was carried out on the basis that a micro-crack had an origin on the machined surface (ground surface) and its maximum width was within 0.1 µm and its length was 0.1 µm or more. Further, an internal crack that did not have an origin on the machined surface was not counted as a micro-crack, and one micro-crack having a plurality of branches connected to each other was regarded as one micro-crack for counting. In addition, even if no origin was observed on the machined surface in the observation field of view, a crack that was recognized as having the origin on the machined surface somewhere other than the observation field of view was counted as a micro-crack.

Each evaluation result is shown in Table 3.

TABLE 3

|  | Grinding Conditions | | | Measurement Results | | Performance Evaluation Micro-crack in Cross Section |
| --- | --- | --- | --- | --- | --- | --- |
|  | Apparatus | Grindstone Count | Degree of Concentration of Abrasive Grains | Surface Roughness Ra (um) | Svk (um) | |
| Example 1 | Surface Grinder | #400 | 125 | 0.44 | 1.068 | 6.6 |
| Example 2 | Surface Grinder | #400 | 150 | 0.41 | 0.860 | 8.4 |
| Example 3 | Surface Grinder | #500 | 90 | 0.45 | 0.772 | 8.0 |
| Example 4 | Surface Grinder | #800 | 75 | 0.21 | 0.489 | 4.2 |
| Comparative Example 1 | Surface Grinder | #400 | 75 | 0.52 | 1.191 | 18.6 |
| Comparative Example 2 | Surface Grinder Polisher | #400 #800 | 75 — | 0.23 | 1.133 | 10.2 |

Since Examples underwent the surface grinding processes under the surface grinding conditions defined according to an embodiment of the present invention, the surface roughness Ra on the sputtering surface was 0.5 μm or less, and the Svk value measured with a laser microscope was 1.1 μm or less. Therefore, good results were obtained in the evaluation of the number of micro-cracks in the cross section.

(Initial Sputtering Evaluation)

Using each of the ITO sputtering targets according to Examples and Comparative Examples after the fine grinding process or the grinding process with the polisher as described above, sputtering was carried out until the target life reached 0.8 kWhr. Subsequently, the following sputtering test was conducted. The film formation conditions were an output of 2.0 kW, a pressure of 0.67 Pa, a gas flow rate of 145 sccm, a film thickness of 55 nm, and an atmosphere of 100% Ar. An amount of particles generated on the substrate (wafer) was then evaluated per unit area.

Table 4 shows the evaluation results of the amount of particles generated in the sputtering test. As can be seen from Table 4, the amount of substrate particles generated in each Example was clearly less than that of each Comparative Example. The columns of "≥1,100 nm" and "≥5,000 nm" indicate the size of particles.

of sputtering are comprised of both particles having approximately several hundred nm to 2000 nm and fine particles having a size of 200 nm generated by the sputtering phenomenon, whereas, in Comparative Example 1, the substrate particles are comprised of particles having a size of from several hundred nm to 6000 nm. Further, the amounts of substrate particles generated in Comparative Example 1 was three times or more as much as that in Example 2. It is assumed that it would significantly affect a defect rate in a liquid crystal panel production line.

What is claimed is:

1. A ceramic sputtering target, the sputtering target having a surface roughness Ra on a sputtering surface of 0.5 μm or less and an Svk value measured with a laser microscope on the sputtering surface of 1.1 μm or less.

2. The ceramic sputtering target according to claim 1, wherein a number of micro-cracks confirmed by observation of a cross-sectional structure in a field of view at magnifications of 10,000 with an electron microscope is 20/mm or less on the sputtering surface.

3. The ceramic sputtering target according to claim 1, wherein the ceramic sputtering target comprises ITO having a Sn content of from 1 to 10% by mass in terms of $SnO_2$.

4. The ceramic sputtering target according to claim 1, wherein the surface roughness Ra on the sputtering surface is 0.1 μm or more.

5. A method for producing a ceramic sputtering target, the method comprises steps of:

TABLE 4

|  | Grinding Conditions | | | Performance Evaluation Number of Substrate Particles (pieces) | |
| --- | --- | --- | --- | --- | --- |
|  | Apparatus | Grindstone Count | Degree of Concentration of Abrasive Grains | ≥1,100 nm | ≥5,000 nm |
| Example 1 | Surface Grinder | #400 | 125 | 312 | 16 |
| Example 2 | Surface Grinder | #400 | 150 | 193 | 11 |
| Example 3 | Surface Grinder | #500 | 90 | 165 | 9 |
| Example 4 | Surface Grinder | #800 | 75 | 107 | 5 |
| Comparative Example 1 | Surface Grinder | #400 | 75 | 890 | 45 |
| Comparative Example 2 | Surface Grinder Polisher | #400 #800 | 75 — | 867 | 44 |

For Example 2 and Comparative Example 1, the amount of substrate particles generated and grains (small pieces released from a damaged layer on the machined surface) in the target life were evaluated, and the results are shown in FIG. 2 and FIG. 3. As can be seen from FIGS. 2 and 3, in Example 2, the substrate particles detected at the initial stage preparing a ceramic sintered body; and subjecting the ceramic sintered body to surface grinding to form a sputtering surface, wherein a surface roughness Ra on the sputtering surface is 0.5 μm or less, and an Svk value measured with a laser microscope on the sputtering surface is 1.1 μm or less after the surface grinding.

6. The method for producing the ceramic sputtering target according to claim 5, wherein a grindstone finally used in the surface grinding of the ceramic sintered body has:
 a count #400 or more and less than 500, and a degree of concentration of abrasive grains of 125 or more, or
 a count #500 or more and less than 800, and a degree of concentration of abrasive grains of 90 or more, or
 a count #800 or more, and a degree of concentration of abrasive grains of 75 or more.

7. The method for producing the ceramic sputtering target according to claim 5, wherein a number of micro-cracks confirmed by observation of a cross-sectional structure in a field of view at magnifications of 10,000 with an electron microscope is 20/mm or less on the sputtering surface after the surface grinding.

8. The method for producing the ceramic sputtering target according to claim 5, wherein the ceramic sputtering target comprises ITO having a Sn content of from 1 to 10% by mass in terms of $SnO_2$.

9. The method for producing the ceramic sputtering target according to claim 5, wherein the surface roughness Ra on the sputtering surface is 0.1 μm or more.

* * * * *